United States Patent
Ahmad et al.

(10) Patent No.: US 8,736,044 B2
(45) Date of Patent: May 27, 2014

(54) LID FOR AN ELECTRICAL HARDWARE COMPONENT

(75) Inventors: Mudasir Ahmad, San Jose, CA (US); Kuo-Chuan Liu, Fremont, CA (US); Mohan Nagar, Cupertino, CA (US); Bangalore Shanker, Fremont, CA (US)

(73) Assignee: Cisco Technology, Inc., San Jose, CA (US)

( * ) Notice: Subject to any disclaimer, the term of this patent is extended or adjusted under 35 U.S.C. 154(b) by 432 days.

(21) Appl. No.: 12/843,680

(22) Filed: Jul. 26, 2010

(65) Prior Publication Data

US 2012/0018872 A1   Jan. 26, 2012

(51) Int. Cl.
 *H01L 23/04* (2006.01)
(52) U.S. Cl.
 USPC ........... 257/704; 257/706; 257/707; 257/720; 257/E23.181
(58) Field of Classification Search
 USPC .......................................... 257/712, 718–720
 See application file for complete search history.

(56) References Cited

U.S. PATENT DOCUMENTS

| 6,114,761 | A  | * | 9/2000 | Mertol et al. ................. 257/722 |
| 7,964,951 | B2 | * | 6/2011 | Refai-Ahmed ............... 257/686 |
| 2009/0057884 | A1 | * | 3/2009 | Too et al. ..................... 257/723 |

OTHER PUBLICATIONS

IBM Microelectronics Division, "CBGA Surface Mount Assembly and Rework User's Guide," May 23, 2002, Hopewell Junction, New York, pp. 1-78.

* cited by examiner

*Primary Examiner* — Thanh Nguyen
(74) *Attorney, Agent, or Firm* — Brinks Gilson & Lione (57) ABSTRACT

To minimize the warpage of an organic substrate that supports at least one electrical hardware component (e.g., a system-in-package module), a bottom surface of a lid is attached to a top surface of the electrical hardware component. The lid includes a leg that extends from the bottom surface of the lid towards a top surface of the substrate. A portion of the leg closest to the substrate may move relative to the substrate. As the lid warps, the lid does not also cause distortion of the substrate. The leg may be a flange that extends at least a portion of the width or at least a portion of the length of the lid, may be a post located at the perimeter of the lid, or may be any other portion extending from above the electrical component towards the substrate.

16 Claims, 5 Drawing Sheets

LID FOR AN ELECTRICAL HARDWARE COMPONENT

FIELD

The present embodiments relate to a lid for an electrical hardware component.

BACKGROUND

In a system-in-package module or something similar, a number of integrated circuits may be included in a single module to provide a complete functional unit that uses few external components. An example of such a system-in-package module may include a combination of specialized processors, DRAM, flash memory, resistors and capacitors mounted or embedded to a single substrate. Organic substrates, which are made of a polymeric material and may be cheaper, thinner and lighter than ceramic substrates, may be used.

A system-in-package module may also include at least one lid. The lid provides thermal cooling for at least some of the electrical hardware components. The lid is attached to the organic substrate to also provide mechanical support for the module during shipping and handling, protecting the module from external loading and reducing the warpage of the substrate.

DETAILED DESCRIPTION OF THE DRAWINGS

Overview

To minimize the warpage of an organic substrate that supports at least one electrical hardware component (e.g., a system-in-package module), a bottom surface of a lid is attached to a top surface of the electrical hardware component. The lid includes a leg that extends from the bottom surface of the lid towards a top surface of the substrate. During manufacturing, reflow soldering may be used to mount the electric hardware component to the substrate and mount the substrate (e.g., the system-in-package module) to a printed circuit board. The heat applied to the system-in-package module during reflow soldering may cause the lid to warp and therefore, cause the substrate to warp. In one embodiment to minimize the warpage of the substrate and minimize the number of resultant solder joint failures between the substrate and the printed circuit board, the lid is decoupled from the substrate. As the lid warps, the lid does not also cause distortion of the substrate. A portion of the leg closest to the substrate may move relative to the substrate. The leg may be a flange that extends at least a portion of the width or at least a portion of the length of the lid, may be a post located at the perimeter of the lid, or may be any other portion extending from above the electrical component towards the substrate.

In one embodiment, an apparatus includes an organic substrate including a top surface, and an electrical hardware component including a top surface and a bottom surface that is attached to the top surface of the substrate. The apparatus also includes a lid that includes a leg and a bottom surface that is attached to the top surface of the electrical hardware component. The leg extends from the bottom surface of the lid towards the top surface of the substrate and has a portion closest to the substrate. The portion of the leg closest to the substrate is operable to move with respect to the substrate, either in contact or not in contact with the substrate.

In another embodiment, an apparatus includes a system-in-package module. The system-in-package module includes an organic substrate including a top surface, a memory including a top surface and a bottom surface that is attached to the top surface of the substrate, and a semiconductor chip including a top surface and a bottom surface that is attached to the top surface of the substrate. The system-in-package module also includes a lid including a leg and a bottom surface that is attached to at least the top surface of the memory. The leg extends from the bottom surface of the lid towards the top surface of the substrate, and a portion of the leg is in contact with the substrate. The portion of the leg in contact with the substrate is operable to move with respect to the substrate.

In yet another embodiment, a method includes attaching a bottom surface of a cover above an electrical hardware component supported on an organic substrate, the cover including an extension extending towards a top surface of the substrate on at least one side of the electrical hardware component. The method also includes applying heat or force to the cover such that the shape of the cover changes, where the extension is operable to move relative to the substrate when the shape of the lid changes.

Example Embodiments

Figure 1:
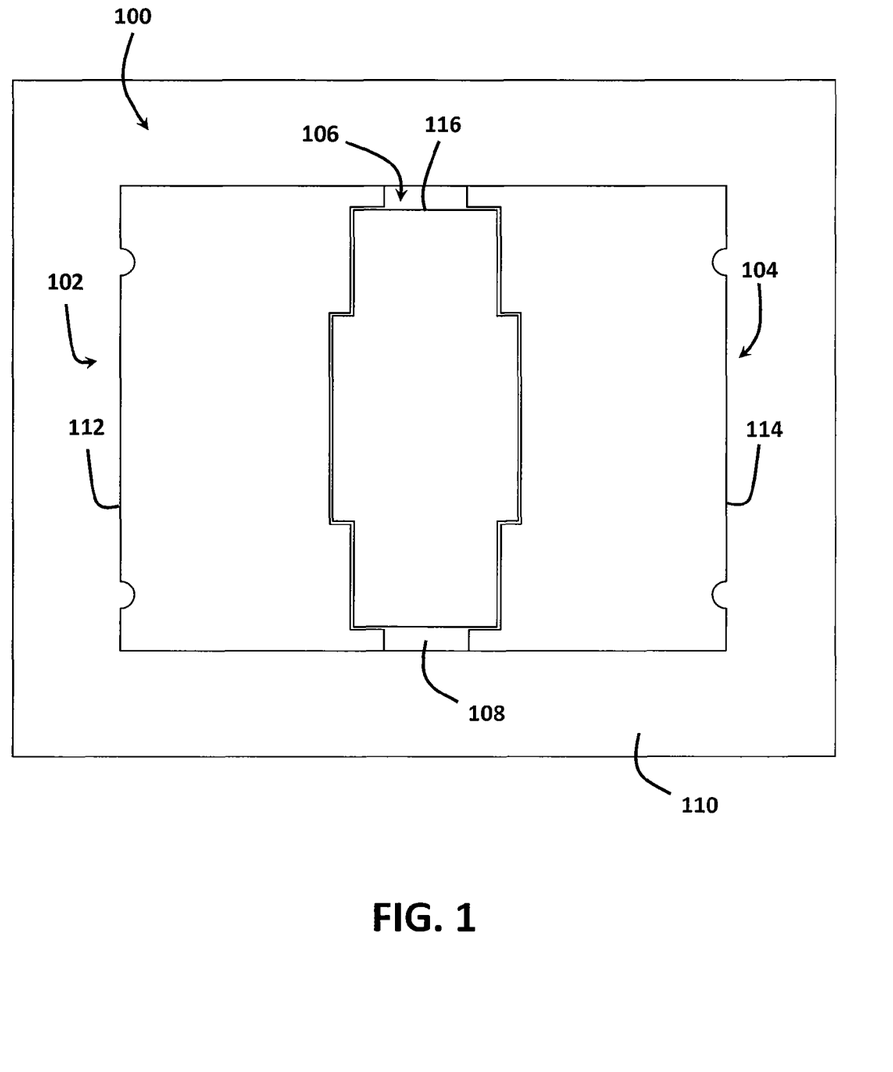
FIG. 1 illustrates a top view of one embodiment of a system-in-package module.
Figure 2:
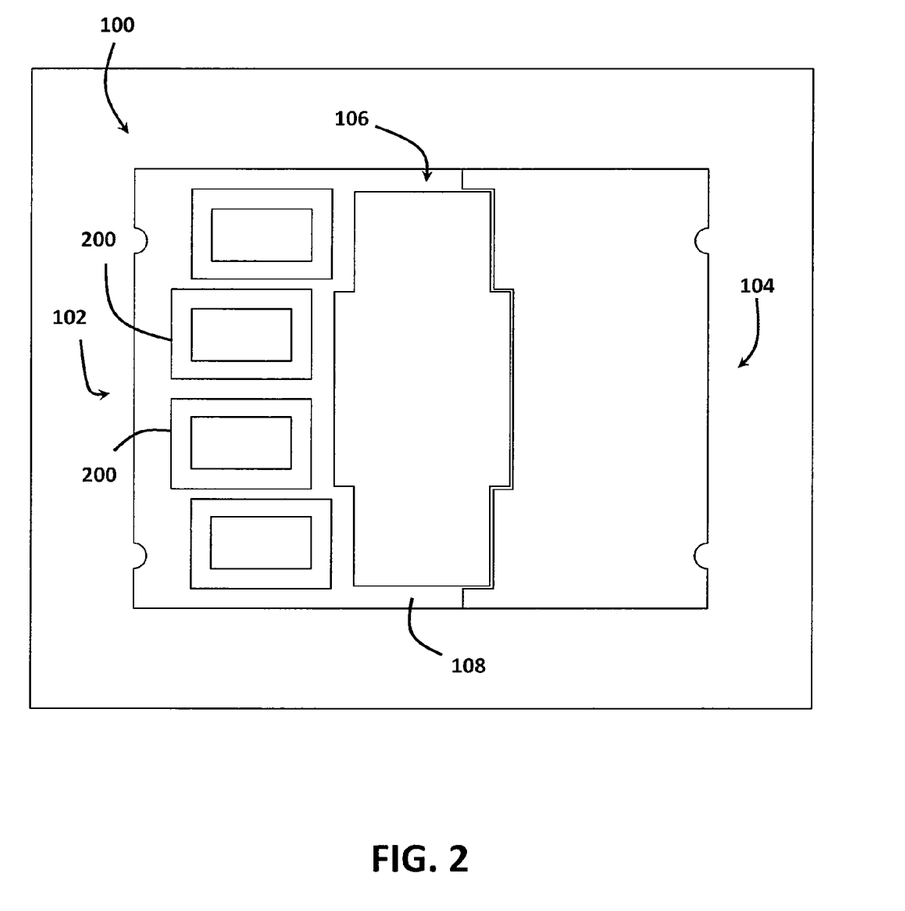
FIG. 2 illustrates a top view of one embodiment of the system-in-package module of FIG. 1 with one lid removed.

FIGS. 1 and 2 illustrate a top view of one embodiment of a system-in-package module 100. The system-in-package module 100 includes a first assembly 102, a second assembly 104 and a third assembly 106. The system-in-package module 100 also includes a substrate 108 that supports each of the three assemblies 102, 104 and 106. Only one, two or more than three assemblies 102, 104, and 106 may be provided. The substrate 108 is an organic substrate 108 (i.e., the substrate is made from a polymeric material) such as, for example, a Bismaleimide Triazine-based (BT-based) substrate 108. Other substrates, such as, for example, direct bonded copper substrates, insulated metal substrates and ceramic substrates, may be used for the substrate 108. The substrate 108 of the system-in-package module 100 is attached to a printed circuit board (PCB) 110.

Each of the three assemblies 102, 104 and 106 includes a lid 112, 114 and 116, respectively. FIG. 2 illustrates a top view of one embodiment of the system-in-package module 100 with one lid 112 removed. As shown in FIG. 2, the first assembly 102 includes four memories 200 (e.g., DRAM). The second assembly 104 also includes four memories 200 (not shown in FIG. 2). Other arrangements and numbers of memories 200 may be provided for the system-in-package module 100. In other embodiments, the system-in-package module 100 and thus each of the three assemblies 102, 104 and 106 may include any number of different, additional, fewer, or other electrical hardware components such as, for example, specialized processors (e.g., application specific integrated circuits (ASICs)), generalized processors, flash memory, resistors and capacitors. The system-in-package module 100 may be used in any application, such as a RAM intensive application including, for example, in cell phones, game consoles, servers, switches and other networking equipment.

Figure 3:
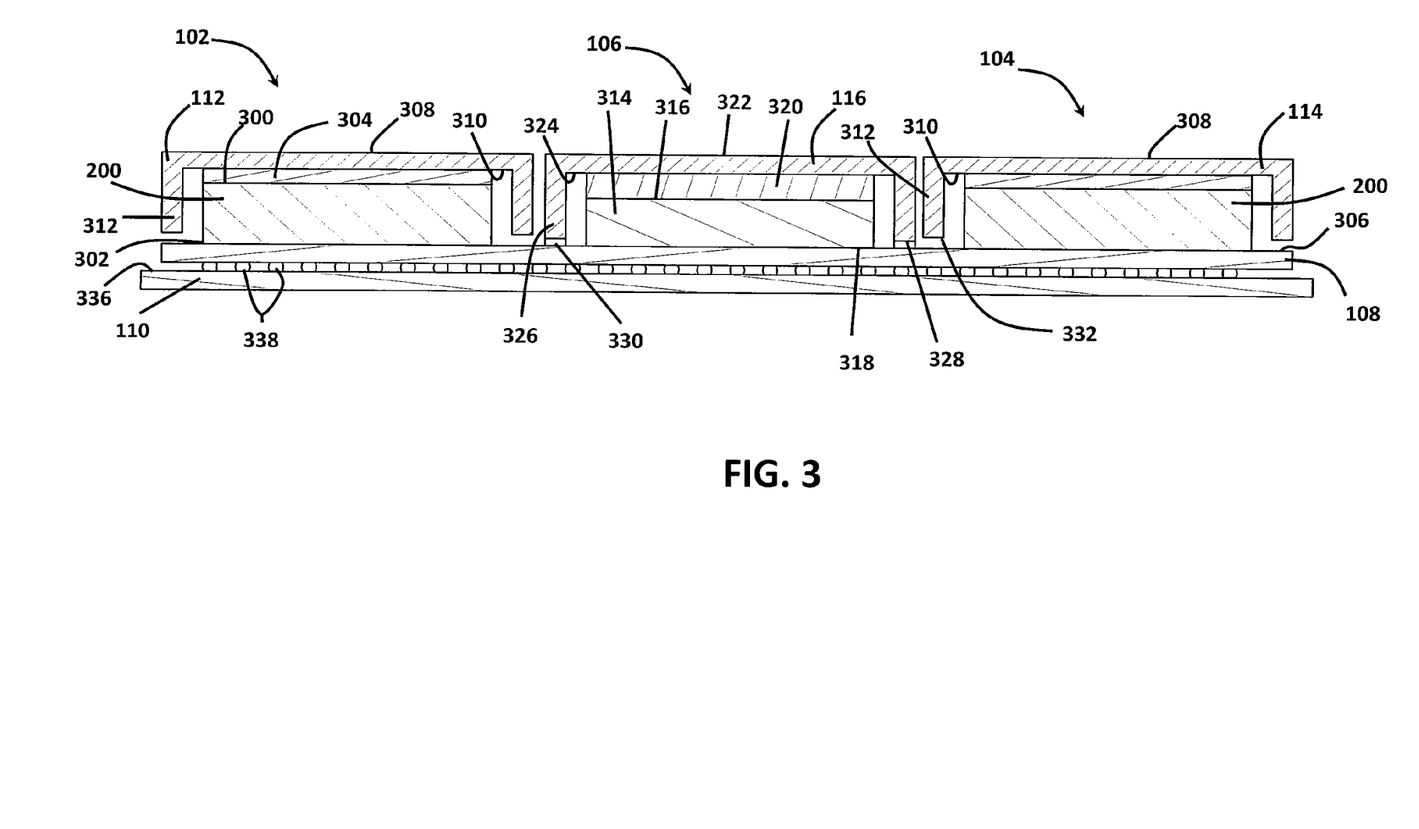
FIG. 3 illustrates a cross-section view of one embodiment of the system-in-package module of FIG. 1.

FIG. 3 illustrates a cross-section view of one embodiment of the system-in-package module 100 or a different system-in-package module. The first assembly 102 includes one or more memories 200 (only one shown in FIG. 3), each memory 200 includes a top surface 300 and a bottom surface 302, a layer of thermal adhesive 304 disposed on the top surface 300 of each memory 200, and the lid 112. The bottom surface 302 of each memory 200 is attached to a top surface 306 of the substrate 108. The attachment may have one or more intervening layers, such as solder or flip chip bonding material. The bottom surface 302 of each memory 200 may be attached to the top surface 306 of the substrate 108 (e.g., via contact pads of the substrate 108) in any number of ways including, for example, with solder or a conductive adhesive.

Both the lid 112 and the lid 114 include a top surface 308, a bottom surface 310 and at least two legs 312. The legs 312 extend from the bottom surface 310 or other portion of each of the lids 112 and 114 in a direction towards the top surface 306 of the substrate 108 and on a side of the memories 200 or other electrical component. The bottom surface 310 of each lid 112 and 114 is attached to the top surface 300 of each memory 200, with the layer of thermal adhesive 304 disposed on the top surface 300 of each memory 200. The thermal adhesive 304 may be any number of adhesives including, for example, a two-part epoxy resin (e.g., silver-based). Other thermal compounds such as, for example, silicone thermal compounds or metal thermal compounds, may be used instead of or in addition to the thermal adhesive 304. Other intervening layers may be provided, such as associated with a stack of electrical components, a thermal conduction layer, or other part. In other embodiments, the bottom surface 310 of the lid is spaced from the electrical component, such as by a gap, air, or other material.

The third assembly 106 includes at least one ASIC 314 (e.g., a semiconductor chip 314). The ASIC 314 has a top surface 316 and a bottom surface 318. The third assembly also includes the lid 116 and a layer of thermal grease 320 disposed on the top surface 316 of the ASIC 314 and/or a bottom surface 324 the lid 116. The third assembly 106 may alternatively or additionally include other components. The bottom surface 318 of the ASIC 314 is attached directly or indirectly to the top surface 306 of the substrate 108. The bottom surface 318 of the ASIC 314 may be attached to the top surface 306 of the substrate 108 (e.g., via contact pads of the substrate 108) in any number of ways including, for example, with solder or conductive adhesive. The ASIC 314 may also be wire or flip chip bonded to the top surface 306 of the substrate 108.

In one embodiment, the ASIC 314 may be a flip chip. Attachment pads (not shown in FIG. 3) of the semiconductor chip 314 are metalized, and solder is deposited on each of the metalized pads. The semiconductor chip 314 is inverted, such that the bottom surface 318 shown in FIG. 3 is the top surface of the semiconductor chip 314. The metalized pads are brought in contact with contact pads of the substrate 108, and the solder deposited on each of the metalized pads is melted using reflow soldering, for example. An electrically-insulating adhesive may be underfilled to strengthen the bond between the semiconductor chip 314 and the top surface of the substrate 108.

The lid 116 includes a top surface 322, the bottom surface 324 and at least two legs 326. The legs 326 extend from the bottom surface 324 or other portion of the lid 116 in a direction towards the top surface 306 of the substrate 108 and on a side of the ASIC 314 or other electrical component. The bottom surface 324 of the lid 116 is attached to the top surface 316 of the ASIC 314, with the layer of thermal grease 320 disposed on the top surface 316 of the ASIC 314. The thermal grease 320 may be any number of thermal greases including, for example, a silver-based thermal grease or a carbon-based thermal grease. Other thermal compounds such as, for example, a silver-based two-part epoxy resin may be used instead of or in addition to the thermal grease 320. The top surface 322 and the bottom surface 324 may be flat, curved, rough or have other texture or shape.

The two legs 326 each include an end 328 that is closest to the top surface 306 of the substrate 108 (e.g., an end 328 that is proximate to or in contact with the top surface 306 of the substrate 108). The end 328 is a point, line, or area, such as a bottom area along a planar surface or flange extending from above the top surface 316 of the component to closer to the top surface 306 of the substrate 108. The end 328 of each of the two legs 326 is attached to the top surface 306 of the substrate 108 with a layer of adhesive 330 that is disposed on the end 328 of each of the two legs 326, between the ends 328 and the top layer of the substrate 306. The layer of adhesive 330 may be any number of adhesives including, for example, an epoxy adhesive. In alternative embodiments, the end 328 is not attached, such as described below for the other lids 112, 114.

The legs 312 of the lids 112 and 114 extend from the bottom surfaces 310 or other portions of the lids 112 and 114 in a direction towards the top surface 306 of the substrate 108, such that an end 332 closest to the top surface 306 of the substrate 108 may be in contact with but not attached to the top surface 306 of the substrate 108 for each of the legs 312. Therefore, the ends 332 of the legs 312 may move relative to the top surface 306 of the substrate 108. Any number of ends 332 may be provided for each lid 112, 114, such as one end in a rectangular shape around the entire component or such as four ends, one on each side of the electrical component.

In one embodiment, the ends 332 of the legs 312 are not in contact with the top surface 306 of the substrate 108 unless an external force is applied to the top surface 308 of a lid 112, 114 or is applied to bend the substrate 108. When an external force is applied to the top surface 308 of the lid 112, the ends 332 of the legs 312 may bottom out on the top surface 306 of the substrate 108, thus providing mechanical support for the system-in-package module 100 during shipping and handling and protecting the system-in-package module 100 from external loading.

A bottom surface 334 of the substrate 108 may be attached to a top surface 336 of the PCB 110. The bottom surface 334 of the substrate 108 includes an array of solder balls 338 (e.g., a ball grid array (BGA) 338) used to conduct electrical signals from the system-in-package module 100 to the PCB 110. The BGA 338 is attached to corresponding contact pads on the PCB 110 using, for example, reflow soldering. During reflow soldering, the system-in-package module 100 and the PCB 110 are subjected to controlled heat, melting the solder of the BGA 338 and connecting the corresponding pads or traces between the memory 200 and the substrate 108, the ASIC 314 and the substrate 108, and between the substrate 108 and the PCB 110. Controlled heating may be accomplished by passing the system-in-package module 100 and the PCB 110 through a reflow oven or an infrared lamp, or soldering each joint individually, for example. Other arrangements of conductive materials such as, for example, an array of conductive pins may be provided on the bottom surface 334 of the substrate 108 to conduct electrical signals from the system-in-package module 100 to the PCB 110.

In one embodiment, the lids 112, 114 and 116 are made of Aluminum Silicon Carbide and are manufactured using a molding process. Due to the molding process, the material of the lids 112, 114 and 116 may not be uniform, and therefore, the lids 112, 114 and 116 may warp when subjected to heat. Other materials such as, for example, copper and nickel may be used for the lids 112, 114 and 116.

Since the legs 312 of the lids 112 and 114 are not attached to the top surface 306 of the substrate 108, the ends 332 of the legs 312 may move relative to the top surface 306 of the substrate 108 if the lids 112, 114 warp. Therefore, the warpage of the lids 112 and 114 does not impart an upward force on the substrate 108, which may otherwise cause solder joint failures between the substrate 108 and the PCB 110. Spacing the ends 332 of the legs 312 away from the substrate 108 may further prevent straining the substrate 108 due to warpage of the lids 112, 114.

In one embodiment, the bottom surface 324 of the lid 116 is attached to the ASIC 314 with a layer of thermal adhesive 304. The legs 326 of the lid 116 extend in a direction towards the top surface 306 of the substrate 108, such that the ends 328 of the legs 326 are in contact with but not attached to the top surface 306 of the substrate 108.

In another embodiment, a bottom surface of a single lid is attached to the top surface 300 of each of the memories 200 and the top surface 316 of the ASIC 314 with layers of thermal adhesive 304. The single lid includes at least two legs or one surrounding leg that extend from the bottom surface of the single lid in a direction towards the top surface 306 of the substrate 108, such that an end of each leg closest to the top surface 306 of the substrate 108 is in contact with but not attached to the top surface 306 of the substrate 108. System-in-package modules 100 with additional numbers of lids may be provided. Different portions of a leg or different legs of a same lid may be connected to the substrate 108, such as connecting one point or side of the lid to the substrate 108, but with the remainder of the lid or legs unconnected.

Figure 4:
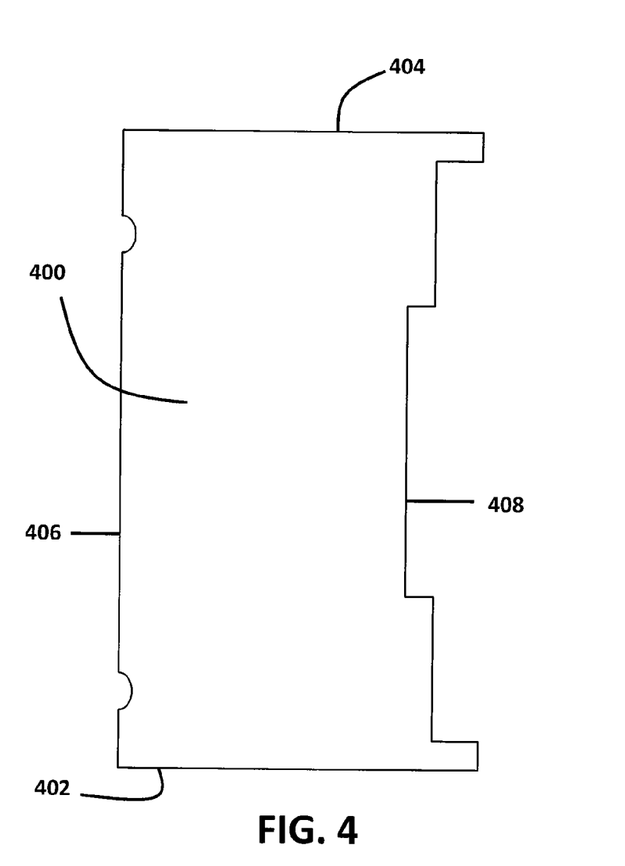
FIG. 4 illustrates a top view of one embodiment of a lid for the system-in-package module of FIG. 1.

FIG. 4 illustrates a top view of one embodiment of a lid 400 for the system-in-package module 100, a different system-in-package module, or a different configuration of electrical hardware components. The lid 400 includes a front 402, a back 404, a first side 406, and a second side 408. The lid 400 may be any number of shapes including, for example, rectangular. The size and shape of the arrangement of electrical hardware components that the lid covers may determine the size and shape of the lid 400. The lid 400 may be any number of materials including, for example, Alumina Silicon Carbide, copper or nickel.

Figure 5:
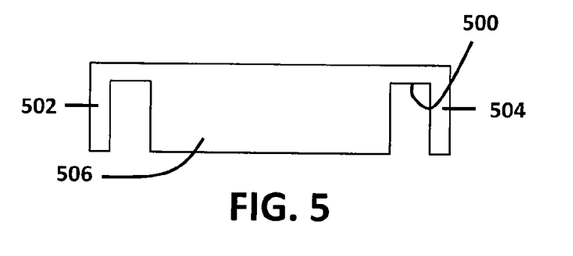
FIG. 5 illustrates a front view of one embodiment of the lid of FIG. 4.

FIG. 5 illustrates a front view of one embodiment of the lid 400 or a different lid. The lid 400 includes a bottom surface 500. A first leg 502 and a second leg 504 extend away from the bottom surface 500 of the lid 400 in a direction perpendicular to the bottom surface 500 of the lid 400. The first leg 502 and the second leg 504 are posts, each with a rectangular cross-section taken in a direction parallel to the bottom surface 500 of the lid 400. The first leg 502 is located at a first corner of the lid 400, at the intersection of the front 402 and the first side 406. The second leg 504 is located at a second corner of the lid 400, at the intersection of the front 402 and the second side 408.

The lid 400 also includes a third leg 506 that runs at least a portion of the width of the lid 400 at the front 402. The third leg 506 is a flange that extends away from the bottom surface 500 of the lid 400 in a direction generally perpendicular to the bottom surface 500 of the lid 400. "Generally" allows for incomplete bending or other angles while still extending from away from the substrate towards the substrate. The height of the third leg 506 is approximately equal to the height of the first leg 502 and the height of the second leg 504.

Figure 6:
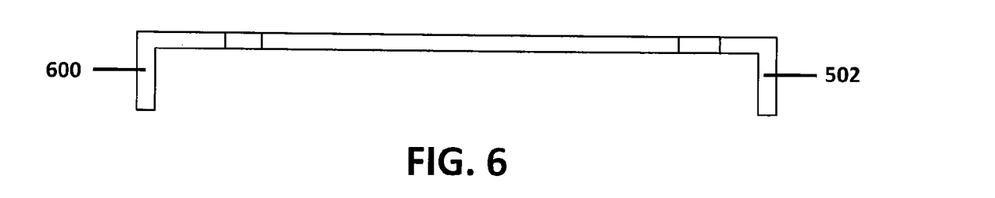
FIG. 6 illustrates a side view of one embodiment of the lid of FIG. 4.

FIG. 6 illustrates a side view of one embodiment of the lid 400 or a different lid. The lid 400 includes a fourth leg 600 and a fifth leg (not shown in FIG. 6) that extend away from the bottom surface 500 of the lid 400 in a direction perpendicular to the bottom surface 500 of the lid 400. The fourth leg 600 and the fifth leg are posts, each with a rectangular cross-section taken in a direction parallel to the bottom surface 500 of the lid 400. The fourth leg 502 is located at a third corner of the lid 400, at the intersection of the back 404 and the first side 406. The fifth leg is located at a fourth corner of the lid 400, at the intersection of the back 404 and the second side 408.

The lid 400 also includes a sixth leg (not shown in FIG. 6) that runs at least a portion of the width of the lid 400 at the back 402. The sixth leg is a flange that extends away from the bottom surface 500 of the lid 400 in a direction perpendicular to the bottom surface 500 of the lid 400. The size of the sixth leg is the same as the size of the third leg 506. Also, the position of the sixth leg relative to the fourth leg 600 and the fifth leg is the same as the position of the third leg 506 relative to the first leg 502 and the second leg 504. The height of the sixth leg is approximately equal to the height of the fourth leg 600 and the height of the fifth leg. In one embodiment, the heights of the first leg 502, second leg 504, third leg 506, fourth leg 600, fifth leg and sixth leg are all approximately equal. The cross-section of any of the legs may vary along the length of the leg. In one embodiment, the legs extend away from the bottom surface 500 of the lid 400 in a direction that is at an acute or obtuse angle to the bottom surface 500 of the lid 400. The legs may also be located interior to the perimeter of the bottom surface 500 of the lid 400 or may connect to the top surface of the lid 400.

In one embodiment, the lid 400 includes four posts, one post being located at each of the four corners of the lid 400. In another embodiment, the lid 400 includes a single post located at one of the four corners of the lid 400. In yet another embodiment, the lid 400 does not include any legs that extend from the lid 400. In other embodiments, one or more legs extend from the sides but not the corners of the lid 400. Other arrangements of flanges, posts, and other extensions may be provided for the lid 400.

Figure 7:
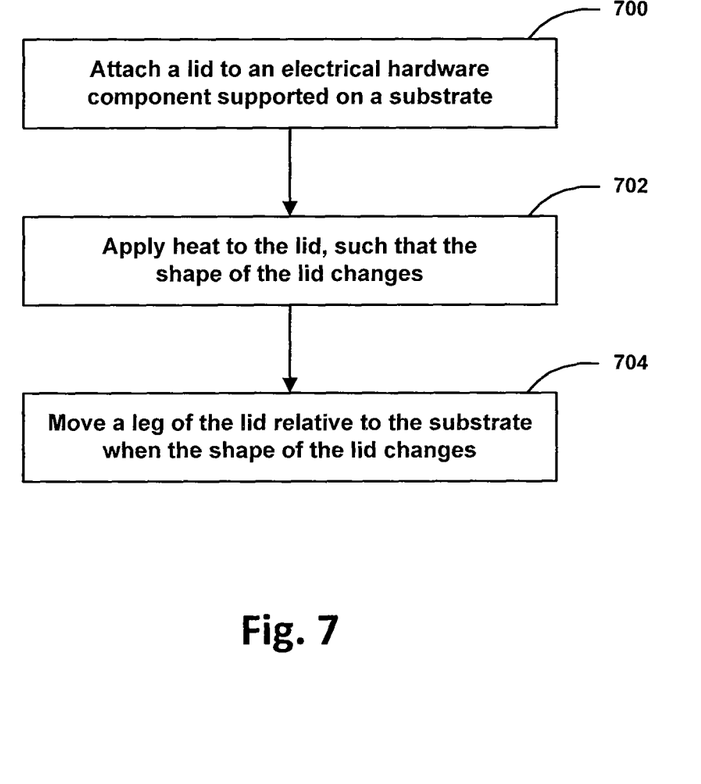
FIG. 7 illustrates a flow chart of minimizing the warpage of one embodiment of the system-in-package module of FIG. 1.

FIG. 7 illustrates a flow chart of minimizing the warpage of the system-in-package module 100 of FIGS. 1 and 2 or a different module. The method is implemented in the order shown, but other orders may be used. Additional, different, or fewer acts may be provided.

At block 700, a lid is attached to or above an electrical hardware component that is supported on an organic substrate. A top surface of the electrical hardware component is attached to a bottom surface of the lid with a layer of thermal compound or positioned under the lid. The thermal compound may be a thermal adhesive or a thermal grease. The lid includes a leg that extends from the bottom surface of the lid towards a top surface of the substrate. The leg may be a post, a flange or other extension from the bottom surface of the lid. The lid may include more than one leg or no legs at all. The leg is located at the perimeter or interior to the perimeter of the bottom surface of the lid.

At block 702, heat or a force is applied to the lid, such that the shape of the lid changes. A bottom surface of the electrical hardware component may be attached to contact pads of a top surface of the substrate using reflow soldering. During reflow soldering, the substrate, the electrical hardware component and the lid are all subjected to controlled heat to melt the solder and attach the bottom surface of the electrical hardware component to the top surface of the substrate. The lid may be made of Aluminum Silicon Carbide and may be manufactured using a molding process. The lid may also be made of other materials, such as copper or nickel. The material of the lid may be non-uniform. When the lid is subjected to the heat during reflow soldering, the lid may warp. The lid may also warp if an external force is applied to the lid.

At block 704, the leg of the lid is moved relative to the substrate when the shape of the lid changes. The leg is in contact with the top surface of the substrate but is not coupled to the top surface of the substrate or is not in contact with the substrate. In one embodiment, the leg may only be in contact with the top surface of the substrate when an external force is applied to the lid. By not fixing the leg relative to the substrate, any deformation of the lid may not strain the substrate. The leg may lend stability to the substrate by contacting the substrate if the substrate is bent.

Various embodiments described herein can be used alone or in combination with one another. The foregoing detailed description has described only a few of the many possible implementations of the present invention. For this reason, this detailed description is intended by way of illustration, and not by way of limitation.

The invention claimed is:

1. An apparatus comprising:
   an organic substrate comprising a top surface;
   a first electrical hardware component comprising a top surface and a bottom surface, the bottom surface being attached to the top surface of the substrate;
   a second electrical hardware component comprising a top surface and a bottom surface, the bottom surface being attached to the top surface of the substrate;
   a first lid comprising an attached leg and a bottom surface, wherein:
      the bottom surface of the first lid is above the top surface of the first electrical hardware component, and
      a portion of the attached leg is attached to the substrate to provide mechanical support to the substrate; and
   a second lid comprising a free leg and a bottom surface, wherein:
      the free leg is located at a perimeter of the second lid,
      the bottom surface of the second lid is above the top surface of the second electrical hardware component,
      the free leg extends from above the top surface of the second electrical hardware component towards the top surface of the substrate and has a portion closest to the substrate, and
      the portion of the free leg closest to the substrate is operable to move relative to the substrate and the first lid to avoid imparting strain on the substrate due to deformation of the second lid.

2. The apparatus of claim 1, wherein the bottom surface of the second lid is attached to the top surface of the second electrical hardware component with a layer of thermal adhesive.

3. The apparatus of claim 1, wherein the second lid is made of Aluminum Silicon Carbide.

4. The apparatus of claim 1, wherein the second lid further comprises a second free leg located at the perimeter of the second lid, extending from the bottom surface of the second lid towards the top surface of the substrate, and having a portion closest to the substrate, and
   wherein the portion of the second free leg closest to the substrate is operable to move with respect to the substrate.

5. The apparatus of claim 4, wherein the second lid further comprises a front and a back, and
   wherein the free leg is a flange that runs at least a portion of the width of the second lid at the front, and the second leg is a flange that runs at least a portion of the width of the second lid at the back.

6. The apparatus of claim 5, wherein the second lid further comprises a third leg, a fourth leg, a fifth leg and a sixth leg, the third, fourth, fifth and sixth legs each located at the perimeter of the second lid, each extending from the bottom surface of the second lid towards the top surface of the substrate, and each having a portion closest to the substrate, and
   wherein the portions of the third, fourth, fifth and sixth legs closest to the substrate are operable to move with respect to the substrate.

7. The apparatus of claim 6, wherein the second lid further comprises a first side and a second side, and
   wherein the third leg is a post located at a corner of the first side and the front, the fourth leg is a post located at a corner of the second side and the front, the fifth leg is a post located at a corner of the first side and the back, and the sixth leg is a post located at a corner of the second side and the back.

8. The apparatus of claim 1, wherein the second lid comprises a plurality of legs, each of the plurality of legs being a post that is located at the perimeter of the second lid and extends from the bottom surface of the second lid to the top surface of the substrate, each of the plurality of legs having a portion closest to the substrate, and
   wherein the portion of each of the plurality of legs closest to the substrate is operable to move with respect to the substrate.

9. The apparatus of claim 1, wherein the second lid is unattached to the top surface of the substrate.

10. An apparatus comprising:
    a system-in-package module comprising:
       a substrate comprising a top surface;
       a memory comprising a top surface and a bottom surface, the bottom surface being attached to the top surface of the substrate;
       a semiconductor chip comprising a top surface and a bottom surface, the bottom surface attached to the top surface of the substrate;
       a memory lid comprising a movable leg and a bottom surface that is attached to at least the top surface of the memory, wherein:
          the movable leg extends from the bottom surface of the memory lid towards the top surface of the substrate, and a portion of the movable leg is in contact with the substrate, and
          the portion of the movable leg in contact with the substrate is free of connection with the substrate such that the memory lid is free of connection with the substrate to prevent distortion of the substrate caused by warpage of the memory lid during reflow soldering of the module; and
       a chip lid comprising a bonded leg and a bottom surface that is attached to the top surface of the semiconductor chip, wherein:
          the bonded leg extends from the bottom surface of the chip lid towards the top surface of the substrate, and a portion of the bonded leg is bonded to the substrate such that the chip lid is bonded to the substrate and the memory lid is movable relative to the chip lid.

11. The apparatus of claim 10, wherein the bottom surface of the memory lid is attached to a top surface of a second semiconductor chip, a bottom surface of the second semiconductor chip attached to the top surface of the substrate.

12. The apparatus of claim 11, wherein the top surface of the memory and the top surface of the second semiconductor chip are each attached to the bottom surface of the memory lid with a layer of thermal adhesive.

13. The apparatus of claim 10, wherein
the bonded leg of the chip lid extends from the bottom surface of the chip lid towards the top surface of the substrate and is attached to the top surface of the substrate.

14. The apparatus of claim 13, wherein the memory lid and the chip lid are both made of Aluminum Silicon Carbide.

15. The apparatus of claim 13, wherein the system-in-package module further comprises a layer of thermal grease disposed on the top surface of the first semiconductor chip.

16. The apparatus of claim 15, wherein the bottom surface of the memory lid is attached to the top surface of the memory with a layer of thermal adhesive.

\* \* \* \* \*